US011016373B2

United States Patent
Wake et al.

(10) Patent No.: US 11,016,373 B2
(45) Date of Patent: May 25, 2021

(54) HEAT RECEIVER HAVING AN ANNULAR FLOW PATH AND MANUFACTURING METHOD OF THE SAME

(71) Applicant: SEIKO EPSON CORPORATION, Tokyo (JP)

(72) Inventors: Tsunehito Wake, Tokyo (JP); Hitoshi Onishi, Tokyo (JP); Jiro Nakajima, Tokyo (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/471,026

(22) PCT Filed: Nov. 7, 2017

(86) PCT No.: PCT/JP2017/040049
§ 371 (c)(1),
(2) Date: Aug. 27, 2019

(87) PCT Pub. No.: WO2018/116670
PCT Pub. Date: Jun. 28, 2018

(65) Prior Publication Data
US 2020/0041882 A1    Feb. 6, 2020

(30) Foreign Application Priority Data

Dec. 22, 2016  (JP) ............................. JP2016-249376

(51) Int. Cl.
*G02F 1/1333* (2006.01)
*G03B 21/16* (2006.01)
(Continued)

(52) U.S. Cl.
CPC ....... *G03B 21/16* (2013.01); *G02F 1/133385* (2013.01); *G03B 21/006* (2013.01); *H05K 7/20981* (2013.01)

(58) Field of Classification Search
CPC ......... G02F 1/133382; G02F 1/133385; G03B 21/16; H05K 7/20981; H04N 9/3144
See application file for complete search history.

(56) References Cited

U.S. PATENT DOCUMENTS 5,170,195 A * 12/1992 Akiyama .......... G02F 1/133385
   349/161
7,085,034 B2 * 8/2006 Fujimori ................ G02B 7/008
   353/52

(Continued)

FOREIGN PATENT DOCUMENTS

JP    2004-102257 A    4/2004
JP    2005-284138 A   10/2005
(Continued)

OTHER PUBLICATIONS

Feb. 13, 2018 International Search Report issued in International Patent Application No. PCT/JP2017/040049.

*Primary Examiner* — Bao-Luan Q Le
(74) *Attorney, Agent, or Firm* — Oliff PLC

(57) ABSTRACT

A heat receiver is configured to cool down a liquid crystal panel in a rectangular shape used for a liquid crystal projector that causes light to be transmitted through the liquid crystal panel and thereby displays a projected image. The heat receiver includes a window portion in a rectangular shape formed to come into contact with an outer periphery of the liquid crystal panel; a flat annular flow path formed on an outer circumferential side of the window portion to surround the window portion and configured to have a narrowed portion in a region along one side of the window portion; and two supply discharge flow paths formed in a neighborhood of two corners of the window portion arranged across the narrowed portion to supply and discharge a heat exchange medium.

11 Claims, 4 Drawing Sheets

(51) Int. Cl.
*G03B 21/00* (2006.01)
*H05K 7/20* (2006.01)

(56) References Cited

U.S. PATENT DOCUMENTS

| | | | | |
|---|---|---|---|---|
| 7,085,081 B2* | 8/2006 | Fujimori | ............ | G02F 1/133385 359/811 |
| 7,130,136 B2* | 10/2006 | Fujimori | ............ | H04N 9/3141 359/820 |
| 7,139,062 B2* | 11/2006 | Saitoh | ............ | G02F 1/133385 349/161 |
| 7,150,543 B2* | 12/2006 | Fujimori | ............ | G03B 21/16 362/373 |
| 7,175,283 B2* | 2/2007 | Kitabayashi | ............ | G03B 21/16 353/54 |
| 7,192,143 B2* | 3/2007 | Fujimori | ............ | G02F 1/133385 348/E9.027 |
| 7,210,789 B2* | 5/2007 | Hoshino | ............ | G02F 1/133385 353/52 |
| 7,216,987 B2* | 5/2007 | Fujimori | ............ | G02F 1/133385 353/54 |
| 7,216,988 B2* | 5/2007 | Kitabayashi | ............ | G02F 1/133385 353/54 |
| 7,270,418 B2* | 9/2007 | Fujimori | ............ | H04N 9/3144 348/E9.027 |
| 7,513,625 B2* | 4/2009 | Zakoji | ............ | G03B 21/16 353/119 |
| 7,537,349 B2* | 5/2009 | Kinoshita | ............ | G03B 21/16 348/748 |
| 7,585,076 B2* | 9/2009 | Kinoshita | ............ | F28F 3/12 348/748 |
| 7,585,077 B2* | 9/2009 | Zakoji | ............ | G03B 21/16 348/748 |
| 7,661,192 B2* | 2/2010 | Fujimori | ............ | B21C 37/15 165/185 |
| 7,717,568 B2* | 5/2010 | Fujimori | ............ | B21D 53/08 29/890.035 |
| 8,083,355 B2* | 12/2011 | Yanagisawa | ............ | H04N 9/3144 353/53 |
| 8,218,095 B2* | 7/2012 | Yanagisawa | ............ | G03B 21/14 349/5 |
| 8,348,433 B2* | 1/2013 | Yanagisawa | ............ | G03B 21/16 165/113 |
| 8,398,245 B2* | 3/2013 | Yanagisawa | ............ | F28D 15/00 165/104.22 |
| 8,651,668 B2* | 2/2014 | Yanagisawa | ............ | G03B 21/16 165/80.4 |
| 8,794,767 B2* | 8/2014 | Yanagisawa | ............ | F25B 21/02 353/54 |
| 9,128,361 B2* | 9/2015 | Yanagisawa | ............ | F25B 21/02 |
| 2003/0231271 A1* | 12/2003 | Saitoh | ............ | G02F 1/133385 349/122 |
| 2005/0162760 A1* | 7/2005 | Fujimori | ............ | H04N 9/3141 359/820 |
| 2005/0185142 A1* | 8/2005 | Fujimori | ............ | H04N 9/3144 353/30 |
| 2005/0185146 A1* | 8/2005 | Fujimori | ............ | G03B 21/16 353/61 |
| 2005/0185245 A1* | 8/2005 | Fujimori | ............ | G02F 1/133385 359/237 |
| 2005/0195460 A1* | 9/2005 | Fujimori | ............ | G03B 21/16 359/237 |
| 2005/0200813 A1* | 9/2005 | Kitabayashi | ............ | H04N 9/3144 353/20 |
| 2005/0213018 A1* | 9/2005 | Hoshino | ............ | G02F 1/133385 349/161 |
| 2005/0213227 A1* | 9/2005 | Fujimori | ............ | G02B 7/008 359/820 |
| 2005/0213228 A1* | 9/2005 | Fujimori | ............ | H04N 9/3105 359/820 |
| 2005/0220156 A1* | 10/2005 | Kitabayashi | ............ | G02F 1/133385 372/35 |
| 2006/0196050 A1* | 9/2006 | Fujimori | ............ | F28D 1/035 29/890.035 |
| 2006/0197917 A1* | 9/2006 | Zakoji | ............ | G03B 21/16 353/54 |
| 2006/0197919 A1* | 9/2006 | Fujimori | ............ | B21C 37/15 353/61 |
| 2006/0198150 A1* | 9/2006 | Kinoshita | ............ | G03B 21/16 362/373 |
| 2007/0051057 A1* | 3/2007 | Zakoji | ............ | G03B 21/16 52/171.3 |
| 2008/0174741 A1* | 7/2008 | Yanagisawa | ............ | H04N 9/3144 353/31 |
| 2009/0237619 A1* | 9/2009 | Yanagisawa | ............ | G03B 21/16 353/54 |
| 2010/0245778 A1* | 9/2010 | Yanagisawa | ............ | G03B 21/16 353/54 |
| 2010/0245779 A1* | 9/2010 | Yanagisawa | ............ | G03B 21/16 353/54 |
| 2010/0253865 A1* | 10/2010 | Yanagisawa | ............ | G03B 21/14 349/5 |
| 2010/0253923 A1* | 10/2010 | Yanagisawa | ............ | F28F 3/12 353/54 |
| 2011/0025985 A1* | 2/2011 | Karasawa | ............ | G03B 21/16 353/54 |
| 2014/0300871 A1* | 10/2014 | Yanagisawa | ............ | F25B 21/02 353/54 |

FOREIGN PATENT DOCUMENTS

| | | |
|---|---|---|
| JP | 2008-197344 A | 8/2008 |
| JP | 2015-114384 A | 6/2015 |

\* cited by examiner

HEAT RECEIVER HAVING AN ANNULAR FLOW PATH AND MANUFACTURING METHOD OF THE SAME

This is a national phase application of PCT/JP2017/040049 filed Nov. 7, 2017, claiming priority to Japanese Patent Application No. JP2016-249376 filed Dec. 22, 2016, the contents of which are incorporated herein by reference.

TECHNICAL FIELD

The present disclosure relates to a heat receiver and a manufacturing method of the same and more specifically a heat receiver configured to cool down a liquid crystal panel that is used for a liquid crystal projector, as well as a method of manufacturing such a heat receiver.

BACKGROUND

A proposed technique employs a duct provided to feed out the air that flows through inside of a projector and to make the air flow through a target surface to be cooled of the liquid crystal panel (as described in, for example, Patent Literature 1). This technique uses an outlet provided to feed out the air in a first direction along the target surface to be cooled of the liquid crystal panel and another outlet provided to be open at a position different from the position of the above outlet and to feed out the air in a second direction that intersects with the first direction when being viewed from a direction opposed to the target surface to be cooled. This technique causes the air fed out in the first direction to flow in a space between the target surface to be cooled and a region where the air fed out in the second direction flows through. This configuration enhances the cooling efficiency.

CITATION LIST

Patent Literature

PTL 1: JP 2015-114384A

SUMMARY

With regard to projectors used to project enlarged images, the recent demand for the high luminance and size reduction of the liquid crystal panel increases the density of luminous flux that passes through the liquid crystal panel and thereby increases the heat generation density of the liquid crystal panel. Such increases make it difficult to sufficiently cool down the liquid crystal panel by the conventional cooling technique. The forced air-cooling system often employed to cool down the projector, such as the technique described above, generally causes size expansion of the cooling system to achieve an increase in cooling performance.

A main object of a heat receiver according to the present disclosure is to be small in size and to have high cooling performance. A main object of a manufacturing method of the heat receiver according to the present disclosure is to relatively easily manufacture a heat receiver that is small in size and that has high cooling performance.

In order to achieve the main object described above, the present disclosure is implemented by aspects of a heat receiver and a manufacturing method of the same described above.

According to one aspect of the present disclosure, there is provided a heat receiver configured to cool down a liquid crystal panel in a rectangular shape used for a liquid crystal projector that causes light to be transmitted through the liquid crystal panel and thereby displays a projected image. The heat receiver includes a window portion in a rectangular shape configured to make visible a display surface of the liquid crystal panel, a flat annular flow path formed on an outer circumferential side of the window portion to surround the window portion and configured to have a narrowed portion in a region along one side of the window portion and two supply discharge flow paths formed in a neighborhood of two corners of the window portion arranged across the narrowed portion to supply and discharge a heat exchange medium.

The heat receiver according to this aspect of the present disclosure includes the window portion in the rectangular shape configured to make visible the display surface of the liquid crystal panel; the flat annular flow path formed on the outer circumferential side of the window portion to surround the window portion and configured to have the narrowed portion in the region along one side of the window portion; and the two supply discharge flow paths formed in the neighborhood of the two corners of the window portion arranged across the narrowed portion to supply and discharge the heat exchange medium. The heat receiver is mounted to the liquid crystal panel such that the display surface of the liquid crystal panel is aligned with the window portion. The heat exchange medium is supplied from one of the two supply discharge flow paths and is discharged from the other of the two supply discharge flow paths. An outer periphery of the liquid crystal panel is arranged to abut on a wall surface of the annular flow path that is formed on the outer circumferential side of the window portion of the heat receiver. Accordingly, the heat receiver causes the heat of the liquid crystal panel to be received by the heat exchange medium from the outer periphery of the liquid crystal panel via the wall surface of the annular flow path. The heat exchange medium used may be, for example, a liquid such as water or oil. This causes the heat receiver to be small in size and to have high cooling performance, compared with a heat receiver of the forced air-cooling system. Furthermore, the heat receiver has the narrowed portion. This configuration ensures the flow rate of the heat exchange medium that is flowed from one of the supply discharge flow paths to the other of the supply discharge flow paths without passing through the narrowed portion and thereby provides the high cooling performance.

In the heat receiver according to the above aspect of the present disclosure, the heat receiver may be configured by joining a first member that forms one of two flat surfaces of the annular flow path opposed to each other with a second member that forms the other of the two flat surfaces. The first member may have an inner circumferential portion that stands upright in a direction perpendicular to the liquid crystal panel to form an inner circumferential side of the window portion, and the second member may have an outer circumferential portion that is joined with an outer circumferential side of the inner circumferential portion of the first member. This configuration suppresses deformation of the first member and the second member that are formed from metal thin plates.

In this case, the heat receiver may further include two tubular members that have inner diameters larger than a thickness of the annular flow path and that are stepped from outer circumferential sides of the respective tubular members to have thin-walled mounting end portions and form the two supply discharge flow paths. The two tubular members may be assembled with the first member and the second member such that the respective mounting end portions of the two tubular members are placed between the first member and the second member. This configuration reduces the thickness of a part of the heat receiver which the two tubular members are mounted to, while ensuring the strength of the part.

According to another aspect of the present disclosure, there is provided a manufacturing method of a heat receiver. The heat receiver is configured to cool down a liquid crystal panel in a rectangular shape used for a liquid crystal projector that causes light to be transmitted through the liquid crystal panel and thereby displays a projected image. The heat receiver includes a window portion in a rectangular shape configured to make visible a display surface of the liquid crystal panel, a flat annular flow path formed on an outer circumferential side of the window portion to surround the window portion and configured to have a narrowed portion in a region along one side of the window portion and two supply discharge flow paths formed in a neighborhood of two corners of the window portion arranged across the narrowed portion to supply and discharge a heat exchange medium. The manufacturing method of the heat receiver includes a process of forming a first member such that one of two flat surfaces of the annular flow path opposed to each other is formed from a metal thin plate and that a brazing filler material adheres to at least a joining part on at least a surface of the first member which forms inside of the annular flow path, a process of forming a second member such that the other of the two flat surfaces is formed from a thin plate identical with the thin plate of the first member and that the brazing filler material adheres to at least a joining part on at least a surface of the second member which forms inside of the annular flow path and a brazing process of heating and brazing the first member and the second member in an assembled state, such as to form the annular flow path.

The manufacturing method of the heat receiver according to this aspect of the present disclosure manufactures the heat receiver including the window portion in the rectangular shape configured to make visible the display surface of the liquid crystal panel; the flat annular flow path formed on the outer circumferential side of the window portion to surround the window portion and configured to have the narrowed portion in the region along one side of the window portion; and the two supply discharge flow paths formed in the neighborhood of the two corners of the window portion arranged across the narrowed portion to supply and discharge the heat exchange medium. The manufacturing method of the heat receiver forms the first member such that one of the two flat surfaces of the annular flow path opposed to each other is formed from the metal thin plate and that the brazing filler material adheres to at least the joining part on at least the surface of the first member which forms inside of the annular flow path. The manufacturing method of the heat receiver also forms the second member such that the other of the two flat surfaces is formed from the thin plate identical with the thin plate of the first member and that the brazing filler material adheres to at least the joining part on at least the surface of the second member which forms inside of the annular flow path. The manufacturing method of the heat receiver then heats and brazes the first member and the second member in the assembled state, such as to form the annular flow path. The manufacturing method of this aspect joins the first member with the second member by means of the brazing filler material to manufacture the heat receiver by simply forming the first member and the second member and heating the first member and the second member in the assembled state. This enables the heat receiver that is small in size and that has the high cooling performance to be manufactured relatively easily. According to a modification, the first member and the second member may respectively be formed from a metal thin plate with a brazing filler material adhering to at least one surface thereof. According to another modification, the first member and the second member may respectively be formed from a metal thin plate, and a brazing filler material may subsequently be applied on a joining part of the first member and the second member.

In the manufacturing method of the heat receiver according to the above aspect of the present disclosure, the process of forming the first member may include a process of forming the first member to have an inner circumferential portion that stands upright in a direction perpendicular to the liquid crystal panel to form an inner circumferential side of the window portion, and the process of forming the second member may include a process of forming the second member to have an outer circumferential portion that is joined with an outer circumferential side of the inner circumferential portion of the first member. This configuration suppresses deformation of the heat receiver.

In the manufacturing method of the heat receiver according to the above aspect of the present disclosure, the manufacturing method of the heat receiver may further include a process of forming two tubular members that have inner diameters larger than a thickness of the annular flow path and that are stepped from outer circumferential sides of the respective tubular members to have thin-walled mounting end portions and form the two supply discharge flow paths. The brazing process may be performed in an assembled state of the two tubular members with the first member and the second member such that the respective mounting end portions of the two tubular members are placed between the first member and the second member. This configuration enables the first member, the second member and the two tubular members to be easily joined together.

DESCRIPTION OF EMBODIMENTS

The following describes some aspects of the present disclosure with reference to an embodiment.

Figure 1:
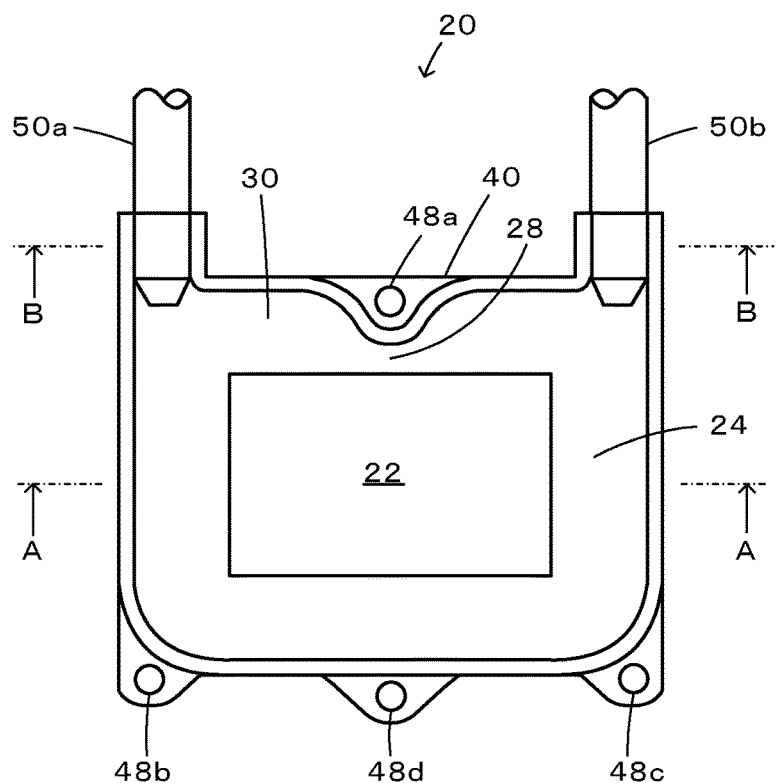
FIG. 1 is a front view illustrating a heat receiver viewed from a front face according to one embodiment of the present disclosure.
Figure 2:
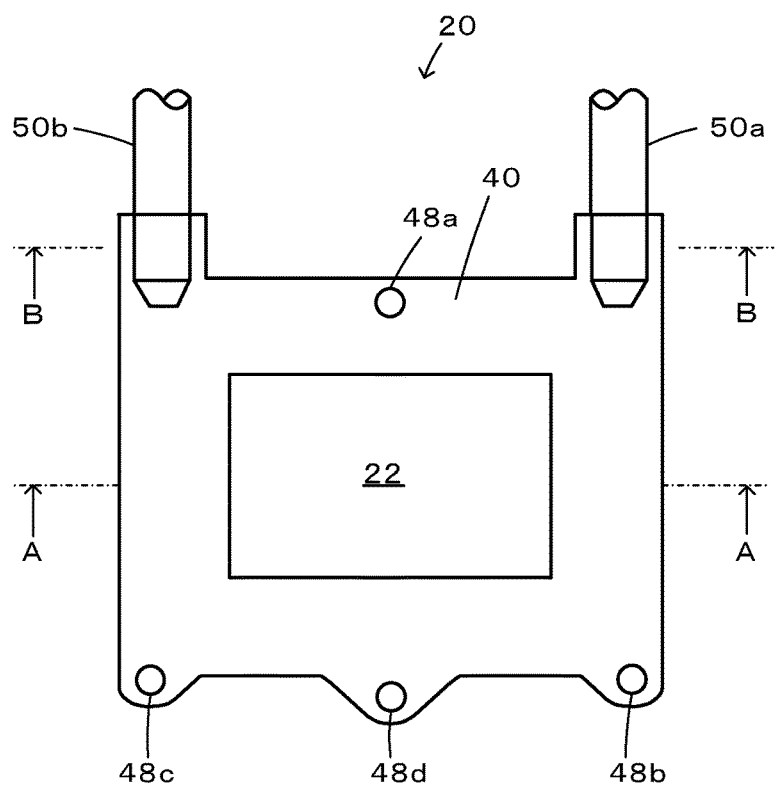
FIG. 2 is a rearview illustrating the heat receiver viewed from a rear face.
Figure 3:
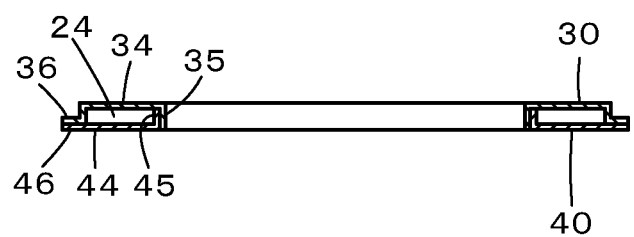
FIG. 3 is a sectional view illustrating the heat receiver viewed from an A-A plane shown in FIG. 1.
Figure 4:
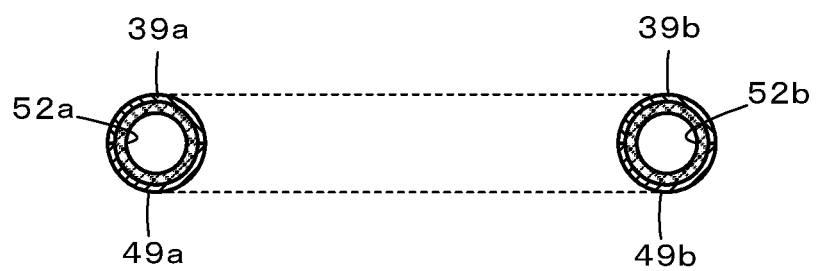
FIG. 4 is a sectional view illustrating the heat receiver viewed from a B-B plane shown in FIG. 1.
Figure 5:
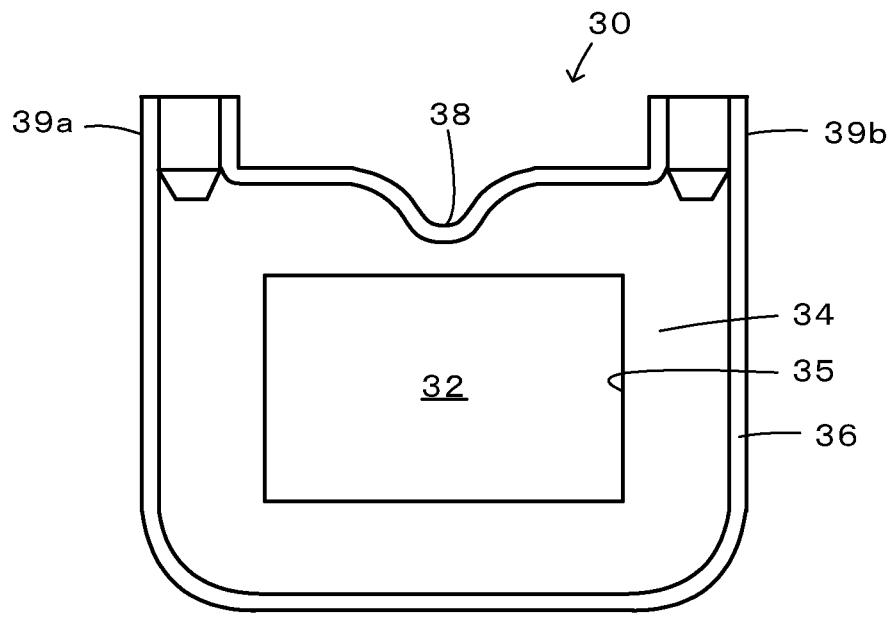
FIG. 5 is a plan view illustrating a first member as a component of the heat receiver.
Figure 6:
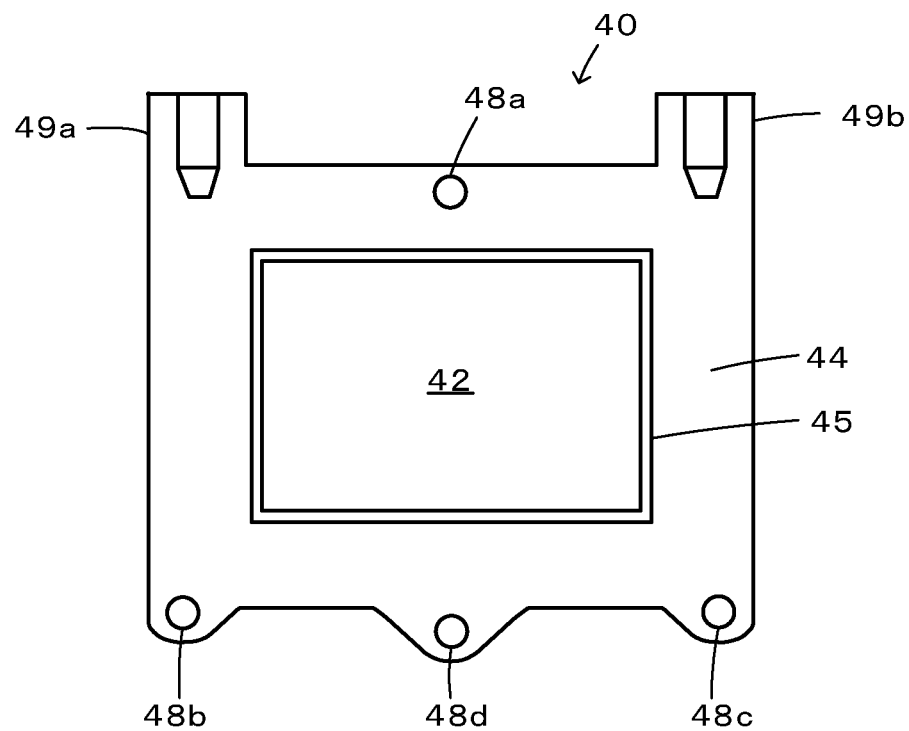
FIG. 6 is a plan view illustrating a second member as a component of the heat receiver.
Figure 7:
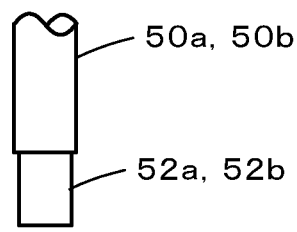
FIG. 7 is a schematic diagram illustrating the schematic configuration of tubular members as components of the heat receiver.

FIG. 1 is a front view illustrating a heat receiver 20 viewed from a front face according to one embodiment of the present disclosure. FIG. 2 is a rear view illustrating the heat receiver 20 viewed from a rear face. FIG. 3 is a sectional view illustrating the heat receiver 20 viewed from an A-A plane shown in FIG. 1. FIG. 4 is a sectional view illustrating the heat receiver 20 viewed from a B-B plane shown in FIG. 1. FIG. 5 is a plan view illustrating a first member 30 as a component of the heat receiver 20. FIG. 6 is a plan view illustrating a second member 40 as a component of the heat receiver 20. FIG. 7 is a schematic diagram illustrating the schematic configuration of tubular members 50a and 50b as components of the heat receiver 20. Broken lines shown in FIG. 4 indicate that the tubular members 50a and 50b are arranged parallel to each other.

As shown in FIGS. 1 to 3, the heat receiver 20 of the embodiment serves as a heat receiving portion in a cooling device, which is configured to cool down a liquid crystal panel in a rectangular shape used for a projector that causes light to be transmitted through the liquid crystal panel and thereby displays a projected image. The heat receiver 20 includes a window portion 22 that has a rectangular shape and that is placed in a center thereof; a flat annular flow path 24 that is formed on an outer circumferential side of the window portion 22 to surround the window portion 22 and that has a narrowed portion 28 provided in a region along one side of the window portion 22; and two tubular members 50a and 50b that are provided in the vicinity of two corners of the window portion 22 arranged across the narrowed portion 28 and that serve as two supply discharge flow paths of supplying and discharging a heat exchange medium.

Members provided in the heat receiver 20 of the embodiment include a first member 30 formed by press working of a brazing sheet that is provided as a thin plate of 0.2 mm in thickness by joining an aluminum alloy brazing filler material with respective surfaces of an aluminum sheet; a second member 40 formed by press working of a brazing sheet that is identical with the brazing sheet of the first member; and the above two tubular members 50a and 50b formed by processing of aluminum pipes. In the heat receiver 20 of the embodiment, the window portion 22 is formed to have a length of 14 mm and a width of 24 mm; the annular flow path 24 is formed to have an inner thickness of 1.1 mm and a width of 4.6 mm; and the two tubular members 50a and 50b are formed to have an outer diameter of 4 mm.

As shown in FIG. 1 and FIGS. 3 to 5, the first member 30 has an opening 32 that is formed in a center thereof to provide the window portion 22; and an annular flow path-forming portion 34 that is formed around the opening 32 to have a "U-shaped" cross section. An inner circumferential side of the "U shape" of the annular flow path-forming portion 34 is formed as an inner circumferential portion 35 that stands upright in a direction perpendicular to the liquid crystal panel (a vertical direction of FIG. 3 and a front-rear direction of the sheet surface of FIG. 5) to form an inner circumferential side of the opening 32 (the window 22). An edge portion 36 is formed on an outer circumferential side of the annular flow path-forming portion to be joined with the second member 40. Semi-tubular mounting portions 39a and 39b are formed at both corners on an upper side of the first member 30 shown in FIG. 5 to mount the tubular members 50a and 50b. A narrowed portion-forming portion 38 is formed in the annular flow path-forming portion 34 between the mounting portions 39a and 39b of the first member 30 to be protruded toward the opening 32-side and thereby form the narrowed portion 28 of the annular flow path 24.

As shown in FIGS. 1 to 4 and FIG. 6, the second member 40 has an opening 42 that is formed in a center thereof to be larger than the inner circumference of the opening 32 of the first member 30 by twice the plate thickness of the first member 30; and an annular flow path-forming portion 44 that is formed around the opening 42 to have an "L-shaped" cross section. An inner circumferential side of the "L shape" of the annular flow path-forming portion 44 is formed as an outer circumferential portion 45 that stands upright in the direction perpendicular to the liquid crystal panel (the vertical direction of FIG. 3 and a front-rear direction of the sheet surface of FIG. 6) and that comes into contact with an outer circumferential side of the inner circumferential portion 35 of the first member 30 when the second member 40 is assembled to the first member 30. An edge portion 46 is formed on an outer circumferential side of the annular flow path-forming portion 44 to be joined with the edge portion 36 of the first member 30. Semi-tubular mounting portions 49a and 49b similar to the mounting portions 39a and 39b of the first member 30 are formed at both corners on an upper side of the second member 40 shown in FIG. 6. Furthermore, through holes 48a to 48d are formed in the middle of the mounting portions 49a and 49b on the upper side and at a center and both corners on a lower side of the second member 40 shown in FIG. 6 to mount the heat receiver 20.

As shown in FIG. 7, the two tubular members 50a and 50b are stepped from the respective outer circumferential sides thereof by the thicknesses of the first member 30 and the second member 40 to have thin-walled mounting end portions 52a and 52b. As shown in FIG. 4, the two tubular members 50a and 50b are assembled with the first member 30 and the second member 40, such that the mounting end portions 52a and 52b are placed between the mounting portions 39a and 39b of the first member 30 and the mounting portions 49a and 49b of the second member 40.

Figure 8:
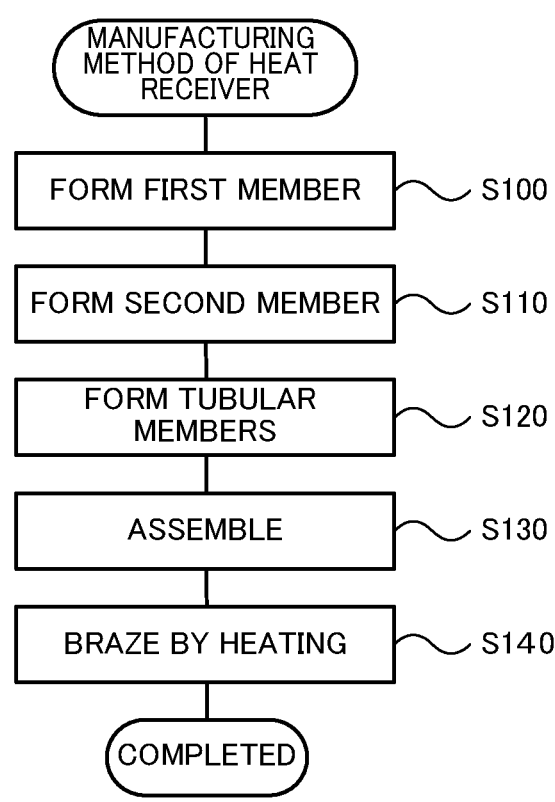
FIG. 8 is a process chart showing one example of a manufacturing method of the heat receiver according to the embodiment.

The following describes a process of manufacturing the heat receiver 20 according to the embodiment. FIG. 8 is a process chart showing one example of a manufacturing method of the heat receiver 20 according to the embodiment. The manufacturing method of the heat receiver 20 first performs processes of forming the first member 30, the second member 40 and the tubular members 50a and 50b (processes S100, S110 and S120). The three processes, i.e., the process of forming the first member 30, the process of forming the second member 40 and the process of forming the tubular members 50a and 50b are illustrated in this sequence in FIG. 8. These processes may, however, be performed in any other sequence or may be performed simultaneously. The process of forming the first member 30 presses the brazing sheet described above to form the first member 30 in the shape described above with reference to FIGS. 1 to 5. The process of forming the second member 40 presses the brazing sheet described above to form the second member 40 in the shape described above with reference to FIGS. 1 to 4 and FIG. 6. The process of forming the tubular members 50a and 50b cuts the aluminum pipes and processes the mounting end portions.

The manufacturing method subsequently performs a process of assembling the first member 30, the second member 40 and the two tubular members 50a and 50b (process S130). The first member 30 and the second member 40 are assembled, such that the mounting end portions 52a and 52b of the two tubular members 50a and 50b are placed between the mounting portions 39a and 39b of the first member 30 and the mounting portions 49a and 49b of the second member 40 and such that the outer circumferential portion 45 of the second member 40 comes into contact with the outer circumferential side of the inner circumferential portion 35 of the first member 30. The manufacturing method then performs a process of brazing by placing and heating the assembled members kept in the assembled state in a furnace that is controlled to a temperature that melts the brazing filler material but does not melt aluminum (process S140). This completes the heat receiver 20.

The following describes the state that the heat receiver 20 having the configuration described above receives heat of the liquid crystal panel. The heat receiver 20 is mounted such that the display surface of the liquid crystal panel is aligned with the window portion 22 and that the second member 40 abuts on the liquid crystal panel. It is here assumed that a heat exchange medium (cooling medium) such as water or oil is supplied from the tubular member 50a and is discharged from the tubular member 50b. The heat exchange medium supplied from the tubular member 50a flows through the narrowed portion 28 on the upper side of the window portion 22 in the annular flow path 24 shown in FIG. 1 and is discharged from the tubular member 50b, while flowing through the left side, the lower side and the right side of the window portion 22 in the annular flow path 24 shown in FIG. 1 and is discharged from the tubular member 50b. The heat of the liquid crystal panel is supplied to the heat exchange medium via a wall surface of the second member 40 that is in contact with an outer periphery of the liquid crystal panel. This results in cooling down the liquid crystal panel. According to the embodiment, the opening area of the narrowed portion 28 is regulated, such that the temperature of the heat exchange medium flowing through the narrowed portion 28 on the upper side of the window portion 22 shown in FIG. 1 to reach the neighborhood of an outlet of the tubular member 50b is substantially equivalent to the temperature of the heat exchange medium flowing through the left side, the lower side and the right side of the window portion 22 shown in FIG. 1 to reach the neighborhood of the outlet of the tubular member 50b in the process of continuously displaying the projected images by irradiation of the liquid crystal panel with light. Accordingly, the heat receiver 20 of the embodiment can efficiently receive the heat of the liquid crystal panel.

The heat receiver 20 of the embodiment described above includes the window portion 22 in the rectangular shape formed to make visible the display surface of the liquid crystal panel; the flat annular flow path 24 formed on the outer circumferential side of the window portion 22 to surround the window portion 22 and configured to have the narrowed portion 28 provided in the region along one side of the window portion 22; and the two tubular members 50a and 50b formed in the vicinity of the two corners of the window portion 22 arranged across the narrowed portion 26 to serve as the two supply discharge flow paths of supplying and discharging the heat exchange medium. The heat exchange medium is supplied from one of the two tubular members 50a and 50b and is discharged from the other of the two tubular members 50a and 50b. This configuration enables the heat receiver 20 to efficiently receive the heat of the liquid crystal panel. Furthermore, the heat receiver 20 uses a liquid such as water or oil as the heat exchange medium. This causes the heat receiver 20 of the embodiment to be small in size and to have high cooling performance, compared with a heat receiver of the forced air-cooling system. Additionally, the opening area of the narrowed portion 28 is regulated, such that the temperature of the heat exchange medium flowing through the narrowed portion 28 on the upper side of the window portion 22 shown in FIG. 1 to reach the neighborhood of an outlet of the tubular member 50b is substantially equivalent to the temperature of the heat exchange medium flowing through the left side, the lower side and the right side of the window portion 22 shown in FIG. 1 to reach the neighborhood of the outlet of the tubular member 50b in the process of continuously displaying the projected images by irradiation of the liquid crystal panel with light. This configuration enables the heat receiver 20 to efficiently receive the heat of the liquid crystal panel.

The manufacturing method of the heat receiver 20 of the embodiment forms the first member 30 and the second member 40 by press working of the brazing sheets and forms the two tubular members 50a and 50b from the aluminum pipes. The manufacturing method then assembles these members 30, 40, 50a and 50b and places and heats the assembled members kept in the assembled state in the furnace that is controlled to the temperature that melts the brazing filler material but does not melt aluminum. This brazes the assembled members and completes the heat receiver 20. This manufacturing method enables the heat receiver 20 to be manufactured relatively easily, compared with the manufacturing methods that employ a welding technique or a cutting technique.

In the heat receiver 20 of the embodiment, the brazing sheet provided as the thin plate of approximately 0.2 mm in thickness by joining the aluminum alloy brazing filler material with the respective surfaces of the aluminum sheet is used to form the first member 30 and the second member 40. A modification may use a brazing sheet of stainless steel or another metal to form the first member and the second member. Another modification may provide preliminary members that are formed from thin plates of aluminum or another metal to have the shapes of the first member and the second member without the brazing filler material and may cause the brazing filler material to adhere to surfaces of the preliminary members where the annular flow path is formed by, for example, spray coating or application coating to form the first member and the second member.

Some aspects of the present disclosure are described above with reference to the embodiment and its modifications. The present disclosure is, however, not limited to any of the embodiment and its modifications described above but may be implemented by any of various other aspects within the scope of the present disclosure.

INDUSTRIAL APPLICABILITY

The present disclosure is applicable to the manufacturing industries of the heat receiver and so on.

The invention claimed is:

1. A heat receiver configured to cool down a liquid crystal panel in a rectangular shape used for a liquid crystal projector that causes light to be transmitted through the liquid crystal panel and thereby displays a projected image, the heat receiver comprising:
  a window portion in a rectangular shape configured to make visible a display surface of the liquid crystal panel;
  a flat annular flow path formed on an outer circumferential side of the window portion to surround the window portion and configured to have a single narrowed portion in a region along one side of the window portion; and
  two supply discharge flow paths formed in a neighborhood of a first corner and a second corner of the window portion to supply and discharge a heat exchange medium, the two supply discharge flow paths including a first supply flow path being disposed at the first corner of the window portion, and a second discharge flow path being disposed at the second corner of the window portion,
the first corner and the second corner being adjacent corners located on the one side of the window portion, and
the single narrowed portion being
disposed between the first supply flow path and the second discharge flow path and between the first and second corners on the one side of the window portion, and
narrower than all other portions of the flat annular flow path, and
the flat annular flow path having a rectangular cross-section at all of the other portions of the flat annular flow path.

2. The heat receiver according to claim 1,
the heat receiver being configured by joining a first member that forms one of two flat surfaces of the annular flow path opposed to each other with a second member that forms the other of the two flat surfaces, wherein
the first member has an inner circumferential portion that stands upright in a direction perpendicular to the liquid crystal panel to form an inner circumferential side of the window portion, and
the second member has an outer circumferential portion that is joined with an outer circumferential side of the inner circumferential portion of the first member.

3. The heat receiver according to claim 2, further comprising:
two tubular members that have inner diameters larger than a thickness of the annular flow path and that are stepped from outer circumferential sides of the respective tubular members to have thin-walled mounting end portions and form the two supply discharge flow paths, wherein
the two tubular members are assembled with the first member and the second member such that the respective mounting end portions of the two tubular members are placed between the first member and the second member.

4. The heat receiver according to claim 1, wherein the flat annular flow path abuts the window portion.

5. The heat receiver according to claim 1, further comprising:
a protrusion disposed between the first supply flow path and the second discharge flow path on the one side, the protrusion protruding toward the window portion to form the single narrowed portion of the flat annular flow path.

6. A manufacturing method of a heat receiver, wherein the heat receiver is configured to cool down a liquid crystal panel in a rectangular shape used for a liquid crystal projector that causes light to be transmitted through the liquid crystal panel and thereby displays a projected image, and the heat receiver comprises a window portion in a rectangular shape configured to make visible a display surface of the liquid crystal panel; a flat annular flow path formed on an outer circumferential side of the window portion to surround the window portion and configured to have a single narrowed portion in a region along one side of the window portion; and two supply discharge flow paths formed in a neighborhood of a first corner and a second corner of the window portion to supply and discharge a heat exchange medium, the two supply discharge flow paths including a first supply flow path being disposed at the first corner of the window portion, and a second discharge flow path being disposed at the second corner of the window portion,
the first corner and the second corner being adjacent corners located on the one side of the window portion, and
the single narrowed portion being
disposed between the first supply flow path and the second discharge flow path and between the first and second corners on the one side of the window portion, and
narrower than all other portions of the flat annular flow path, and
the flat annular flow path having a rectangular cross-section at all of the other portions of the flat annular flow path,
the manufacturing method of the heat receiver comprising:
a process of forming a first member such that one of two flat surfaces of the annular flow path opposed to each other is formed from a metal thin plate and that a brazing filler material adheres to at least a joining part on at least a surface of the first member which forms inside of the annular flow path;
a process of forming a second member such that the other of the two flat surfaces is formed from a thin plate identical with the thin plate of the first member and that the brazing filler material adheres to at least a joining part on at least a surface of the second member which forms inside of the annular flow path; and
a brazing process of heating and brazing the first member and the second member in an assembled state after (i) the first member has been formed with the brazing filler material adhered to at least the joining part of the first member, and (ii) the second member has been formed with the brazing filler material adhered to at least the joining part of the second member, such as to form the annular flow path.

7. The manufacturing method of the heat receiver according to claim 6,
wherein the process of forming the first member comprises a process of forming the first member to have an inner circumferential portion that stands upright in a direction perpendicular to the liquid crystal panel to form an inner circumferential side of the window portion, and
the process of forming the second member comprises a process of forming the second member to have an outer circumferential portion that is joined with an outer circumferential side of the inner circumferential portion of the first member.

8. The manufacturing method of the heat receiver according to claim 7, further comprising:
a process of forming two tubular members that have inner diameters larger than a thickness of the annular flow path and that are stepped from outer circumferential sides of the respective tubular members to have thin-walled mounting end portions and form the two supply discharge flow paths, wherein
the brazing process is performed in an assembled state of the two tubular members with the first member and the second member such that the respective mounting end portions of the two tubular members are placed between the first member and the second member.

9. The manufacturing method of the heat receiver according to claim 6, further comprising:
a process of forming two tubular members that have inner diameters larger than a thickness of the annular flow path and that are stepped from outer circumferential sides of the respective tubular members to have thin-walled mounting end portions and form the two supply discharge flow paths, wherein the brazing process is performed in an assembled state of the two tubular members with the first member and the second member such that the respective mounting end portions of the two tubular members are placed between the first member and the second member.

10. The manufacturing method to claim 6, wherein the flat annular flow path abuts the window portion.

11. The manufacturing method to claim 6, further comprising:

a protrusion disposed between the first supply flow path and the second discharge flow path on the one side, the protrusion protruding toward the window portion to form the single narrowed portion of the flat annular flow path.

* * * * *